(12) United States Patent
MacManus

(10) Patent No.: US 12,396,134 B2
(45) Date of Patent: Aug. 19, 2025

(54) HEATSINK CHASSIS WITH AEROFOIL

(71) Applicant: Rakuten Symphony, Inc., Tokyo (JP)

(72) Inventor: Gerard MacManus, Surrey (GB)

(73) Assignee: Rakuten Symphony, Inc., Tokyo (JP)

( * ) Notice: Subject to any disclaimer, the term of this patent is extended or adjusted under 35 U.S.C. 154(b) by 0 days.

(21) Appl. No.: 18/020,479

(22) PCT Filed: Jul. 29, 2022

(86) PCT No.: PCT/US2022/038770
§ 371 (c)(1),
(2) Date: Feb. 9, 2023

(87) PCT Pub. No.: WO2023/229618
PCT Pub. Date: Nov. 30, 2023

(65) Prior Publication Data
US 2024/0268075 A1  Aug. 8, 2024

Related U.S. Application Data

(60) Provisional application No. 63/345,786, filed on May 25, 2022.

(51) Int. Cl.
*H05K 7/20* (2006.01)
(52) U.S. Cl.
CPC ................ *H05K 7/20409* (2013.01)
(58) Field of Classification Search
CPC .................................. H05K 7/20409
See application file for complete search history.

(56) References Cited

U.S. PATENT DOCUMENTS

| | | | |
|---|---|---|---|
| 7,111,667 B2 | 9/2006 | Chang | |
| 9,107,326 B2 * | 8/2015 | MacManus | ........ H05K 7/20127 |
| 11,003,225 B2 | 5/2021 | Reed et al. | |
| 12,142,811 B2 * | 11/2024 | Ji | .............................. F28F 3/12 |
| 2022/0346278 A1 * | 10/2022 | Kodama | ............ H05K 7/20318 |

FOREIGN PATENT DOCUMENTS

WO  WO-2015157523 A1 * 10/2015 ................ F28F 3/02

OTHER PUBLICATIONS

International Search Report and Written Opinion of the International Searching Authority issued by the United States Patent and Trademark Office for corresponding International Patent Application No. PCT/US22/38770, electronically delivered on Dec. 2, 2022.

* cited by examiner

*Primary Examiner* — Gordon A Jones
(74) *Attorney, Agent, or Firm* — Myers Wolin, LLC

(57) ABSTRACT

A chassis is provided for a circuit board, the chassis having a heatsink. The chassis includes a plurality of fins extending from the chassis for extracting heat from electronics mounted on the chassis. The plurality of fins are organized into at least two fin sections, wherein a first fin section has a first set of fins of the plurality of fins and a second fin section has a second set of fins of the plurality of fins. The chassis further provides a thermal break between the first fin section and the second fin section, the thermal break being an air gap between the first set of fins and the second set of fins. An aerofoil is then fixed in the air gap and inhibits air flow between the first fin section and the second fin section.

12 Claims, 9 Drawing Sheets

HEATSINK CHASSIS WITH AEROFOIL

CROSS-REFERENCE TO RELATED APPLICATION

This application is a national stage application of International Application No. PCT/US2022/038770, filed on Jul. 29, 2022 and designated the U.S., which claims priority to U.S. Provisional Patent Application No. 63/345,786, filed on May 25, 2022. The contents of each are herein incorporated by reference.

FIELD OF THE INVENTION

This application relates to a chassis for supporting PCB having heatsinks for dissipating heat.

BACKGROUND

Various electronic devices may comprise various circuit boards and other electronic components mounted on cooling structures. Such cooling structures may include a chassis with a mounting surface on one side and various cooling features integrated into the chassis. Such cooling features may include cooling fins on a side of the chassis opposite the mounting surface, such that the cooling fins can draw heat away from a circuit board or other electronic components mounted on the mounting surface.

As an example, wireless communication devices such as mMIMO (massive Multiple-Input Multiple-Output) devices may be cooled using a chassis having a mounting surface on one side and may be cooled by either a fan or a fanless structure. This may include a fanless conductor, such as a finned heatsink, or a combination of fanless and fan-cooled structures, depending on the size of the device and/or power consumption requirements. Devices are typically designed and constructed to be either fanless or fan-cooled.

In some such electronic devices, circuit boards may be installed on a mounting surface of a chassis, the chassis including a heat sink, such as a finned heat sink. The circuit boards may then be enclosed in a housing or otherwise configured such that most or all heat generated by the circuit boards and related electronics must be dissipated by way of the heat sink.

There is a need, particularly in the context of fanless devices primarily cooled by a heat sink or the like, for improved devices for addressing heat management.

SUMMARY

A chassis is provided for a circuit board, the chassis having a heatsink. The chassis includes a plurality of fins extending from the chassis for extracting heat from electronics mounted on the chassis. The plurality of fins are organized into at least two fin sections, wherein a first fin section of the at least two fin sections comprises a first set of fins of the plurality of fins and a second fin section of the at least two fin sections comprises a second set of fins of the plurality of fins.

The chassis further provides a thermal break between the first fin section and the second fin section, the thermal break being an air gap between the first set of fins and the second set of fins.

An aerofoil is then fixed in the air gap and inhibits air flow between the first fin section and the second fin section.

In some embodiments, the fins of the first set of fins and the fins of the second set of fins are each arranged in substantially parallel planes to each other. The aerofoil then extends from the chassis in the same direction as the plurality of fins but is not parallel to the first set of fins.

In some such embodiments, at least a portion of the aerofoil is angled with respect to a line perpendicular to the first set of fins. In some such embodiments, the first fin section and the second fin section each have a width and a length, and each fin of the second set of fins is elongated substantially in parallel to the length of the second fin section and the second set of fins are spaced apart along the width of the second fin section. The aerofoil is then bent such that it extends along the width of the second fin section and angles towards the second fin section at both ends of the width.

In some embodiments, during use, the second fin section is located below the first fin section.

In some embodiments, the aerofoil generates a temperature differential between the first fin section and the second fin section.

In some embodiments, the thermal break forms a channel perpendicular to the fins of the first set of fins and the fins of the second set of fins. The aerofoil then directs air flow entering the channel towards the first fin section.

In some such embodiments, the aerofoil has a first end, a second end, and a center. Each of the first end and the second end is then closer to the second fin section than the center. In some such embodiments, the first end and the second end are adjacent a first and last fin of the second set of fins respectively. The first and second end may then inhibit air flow entering the channel from entering the second fin section.

In some such embodiments, the first fin section and the second fin section are not enclosed by a housing. Accordingly, even when air flow does not cool the second fin section by way of the thermal breaks, heated air still exits the second fin section in a direction perpendicular to the plurality of fins and the aerofoil.

In some embodiments, the chassis includes at least one support structure for locating the aerofoil relative to the first fin section and the second fin section. In some such embodiments, the support structure is at least one blade extending from the chassis in parallel with the plurality of fins. The support structure may then extend into each of the first fin section and the second fin section and pass between fins of each of the first set of fins and the second set of fins.

In some such embodiments, the aerofoil comprises at least one slot. The aerofoil may then be located by positioning the slot on the at least one blade. In some such embodiments the at least one support structure is two blades, and the aerofoil comprises two slots. The two slots have a first distance between them along a surface of the aerofoil, and the two blades are spaced apart by a second distance smaller than the first distance.

In some embodiments, the chassis includes a circuit board mounting surface on a first side, and the plurality of fins extend from the chassis on a side opposite the circuit board mounting surface.

In some such embodiments, the chassis includes a first group of circuitry opposite the first fin section and a second group of circuitry opposite the second fin section. The first group of circuitry may then have different temperature requirements than the second group of circuitry.

Similarly, the chassis may include a first group of circuitry opposite the first fin section and a second group of circuitry opposite the second fin section, and the first group of circuitry generates a different amount of heat than the second group of circuitry.

In some embodiments, a third fin section is provided comprising a third set of fins and a second thermal break between the third fin section and the first and second fin sections.

DETAILED DESCRIPTION OF THE PREFERRED EMBODIMENTS

Figure 1:
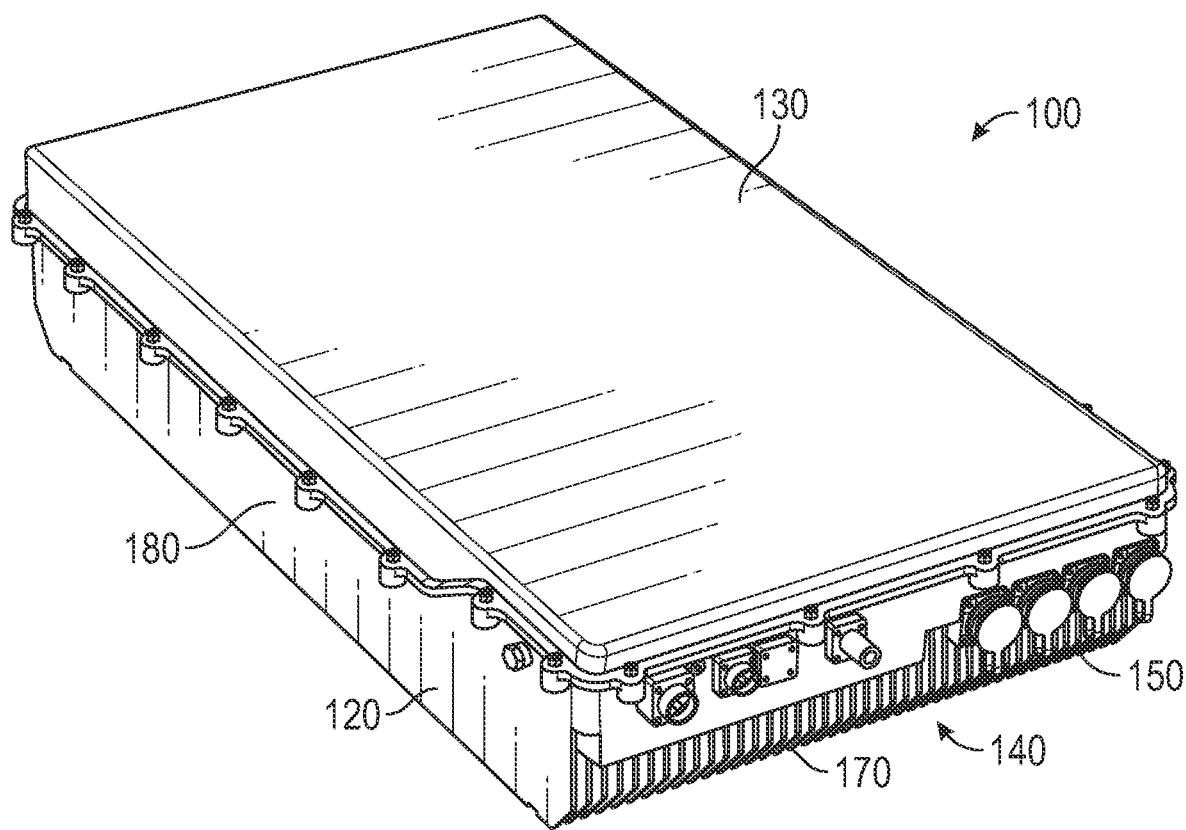
FIG. 1 is a device in accordance with this disclosure.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Figure 2:
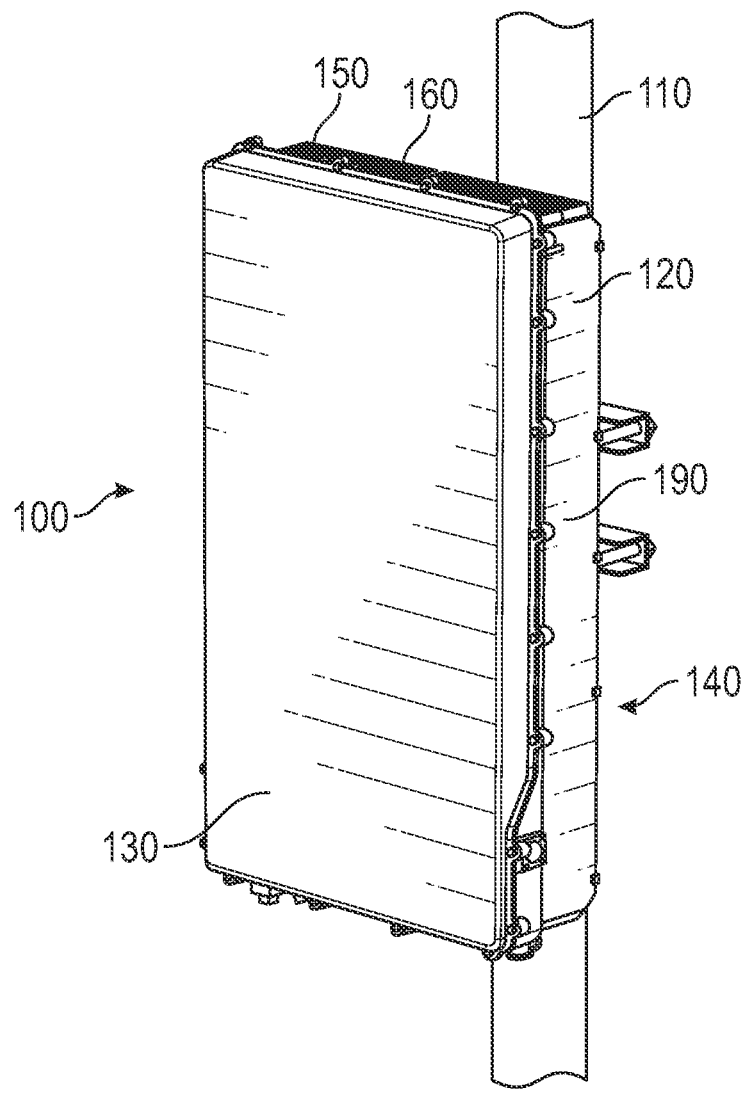
FIG. 2 is the device of FIG. 1 mounted on a post.
Figure 3:
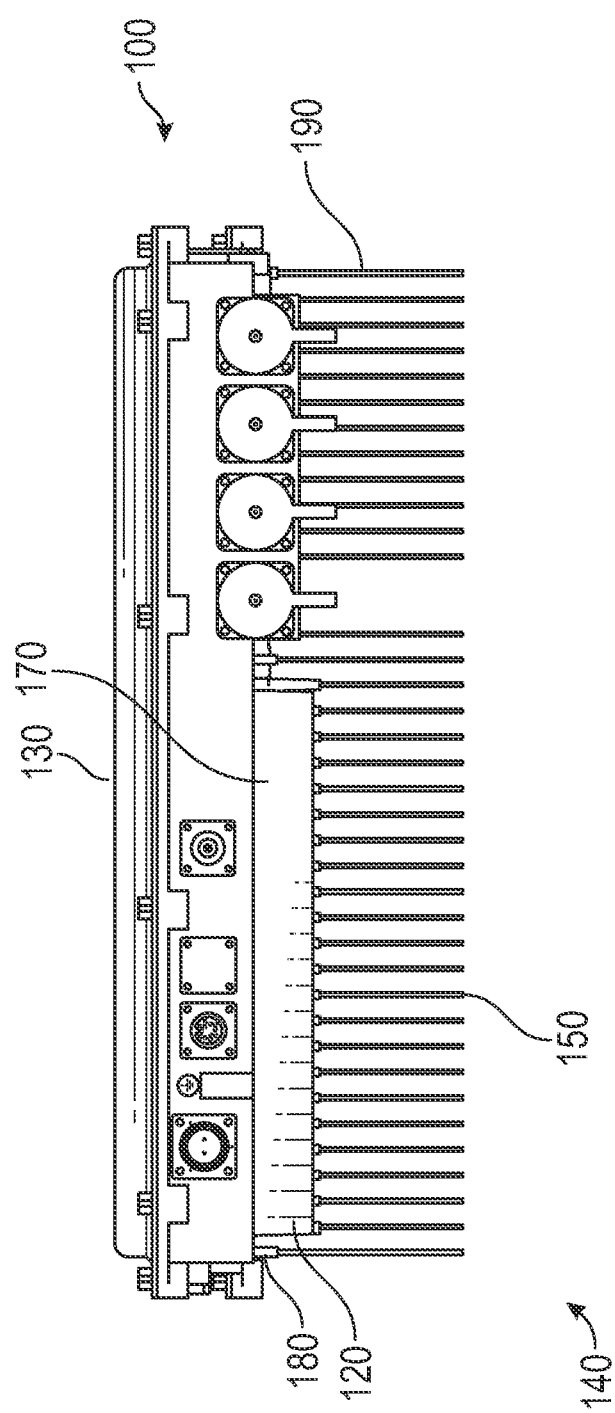
FIG. 3 is a top view of the device of FIG. 1.

FIG. 1 is a device 100 in accordance with this disclosure. FIG. 2 is the device 100 of FIG. 1 mounted on a post 110. FIG. 3 is a top view of the device 100 of FIG. 1.

As shown, the device 100 may include a chassis 120 supporting various electronics, such as an mMIMO (massive Multiple-Input Multiple-Output) device with significant cooling requirements. The electronics may be installed in a housing 130 installed on the chassis 120. As such, the housing 130 may enclose a mounting surface supporting various circuit boards and other electronic devices that require cooling.

Opposite the housing 130, the chassis 120 may provide a cooling heatsink 140, which may be a fanless structure comprising a large number of fins 150. The fins 150, along with portions of the chassis 130 itself, are typically formed from a conductive material and thereby draw heat away from the housing 130. Accordingly, the chassis 120 typically has a mounting surface on a first side, and the fins 150 extend from the chassis on a second side opposite the circuit board mounting surface.

As shown in FIG. 2, during use, the device 100 may be installed on a post 110, such that at least some of the fins 150 are located adjacent the post. As such, the chassis 120 may be designed such that as much heat as possible can be removed from the fins at the top 160, bottom 170, and sides 180, 190 of the device 100.

Figure 4:
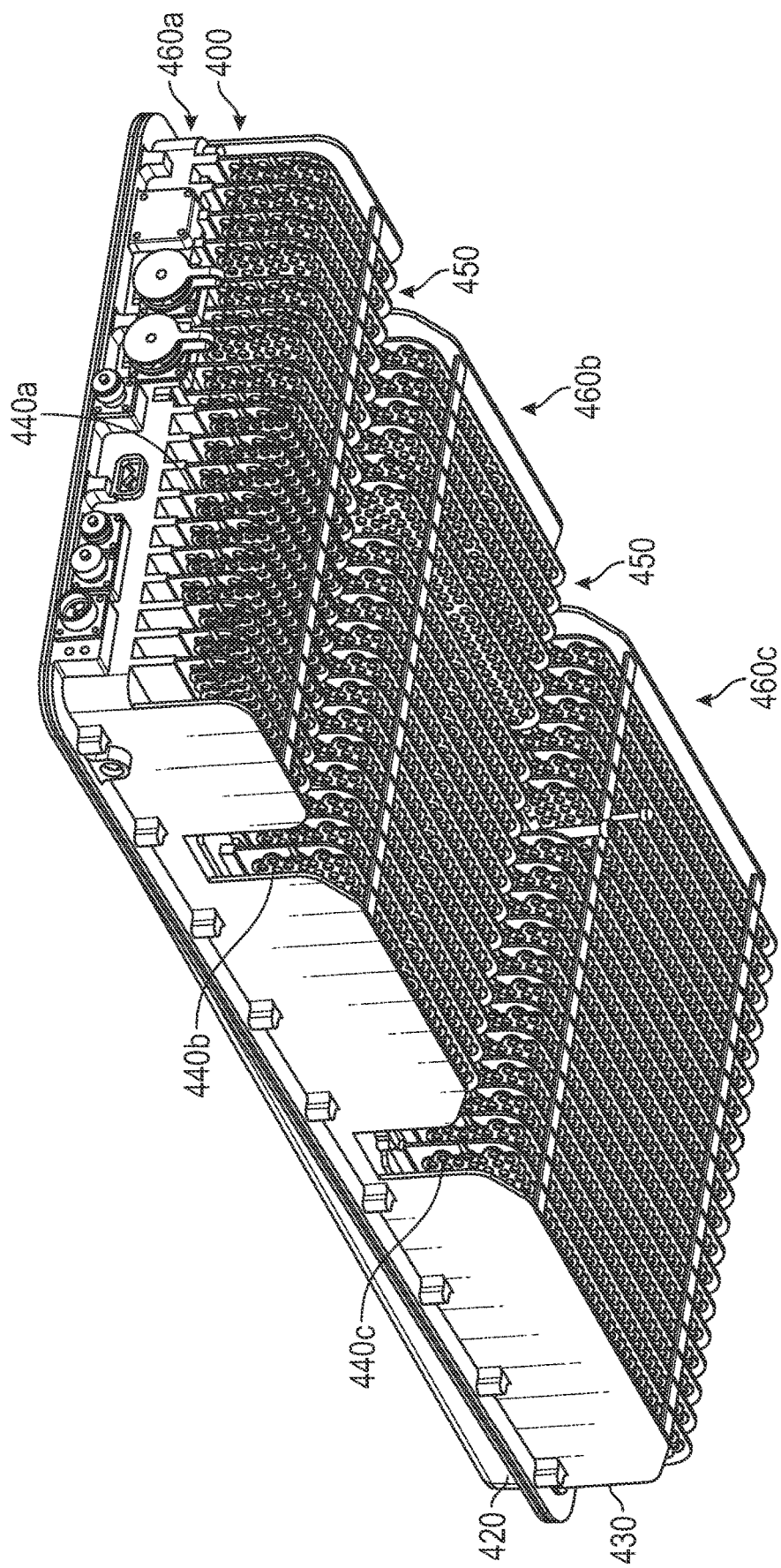
FIG. 4 is a perspective view of a device in accordance with this disclosure without an aerofoil installed.
Figure 5:
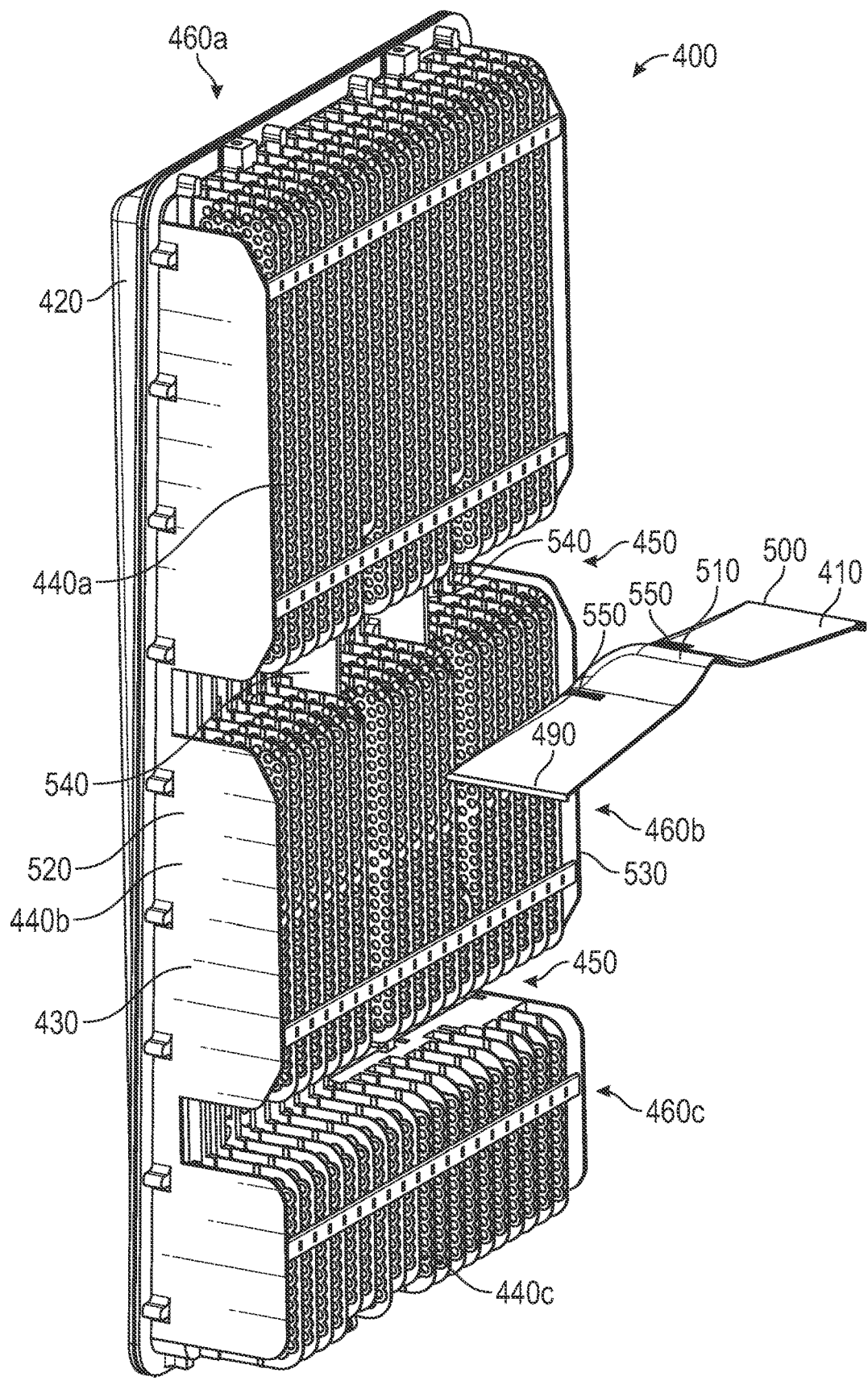
FIG. 5 is a perspective view of the device of FIG. 4 with an uninstalled aerofoil.
Figure 6:
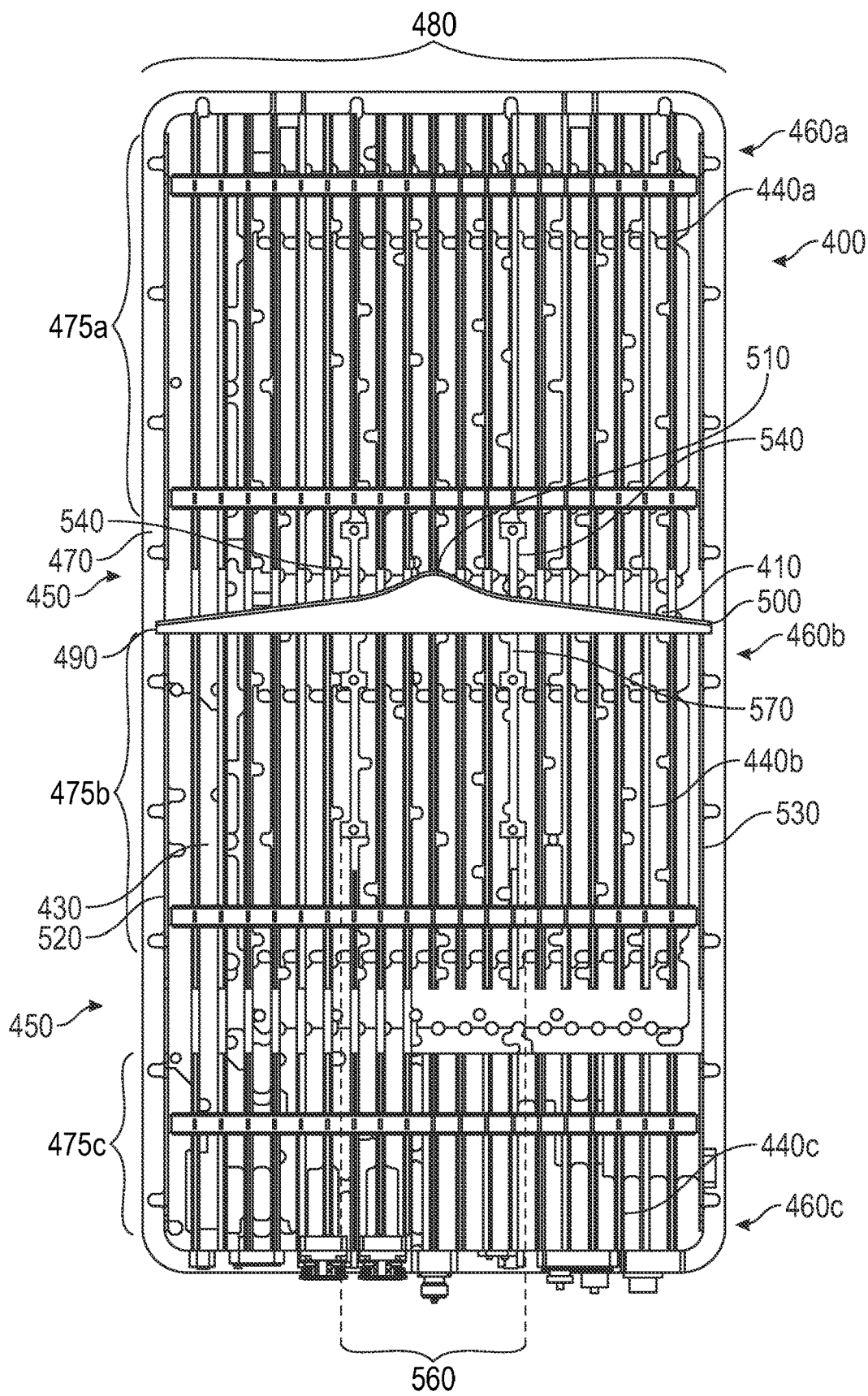
FIG. 6 is an elevation view of the device of FIG. 4 with the aerofoil installed.
Figure 7:
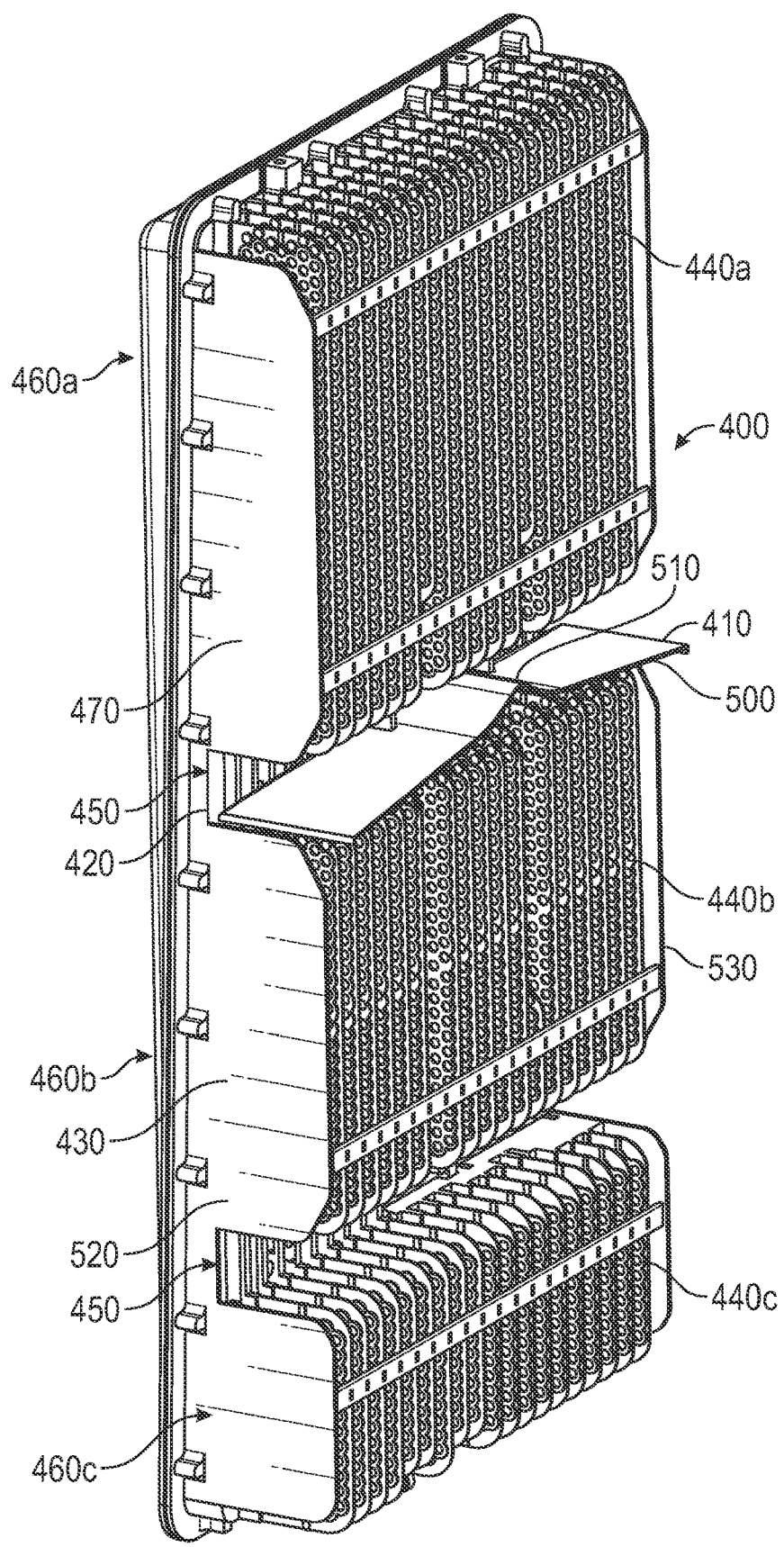
FIG. 7 is a perspective view of the device of FIG. 4 with the aerofoil installed.
Figure 8:
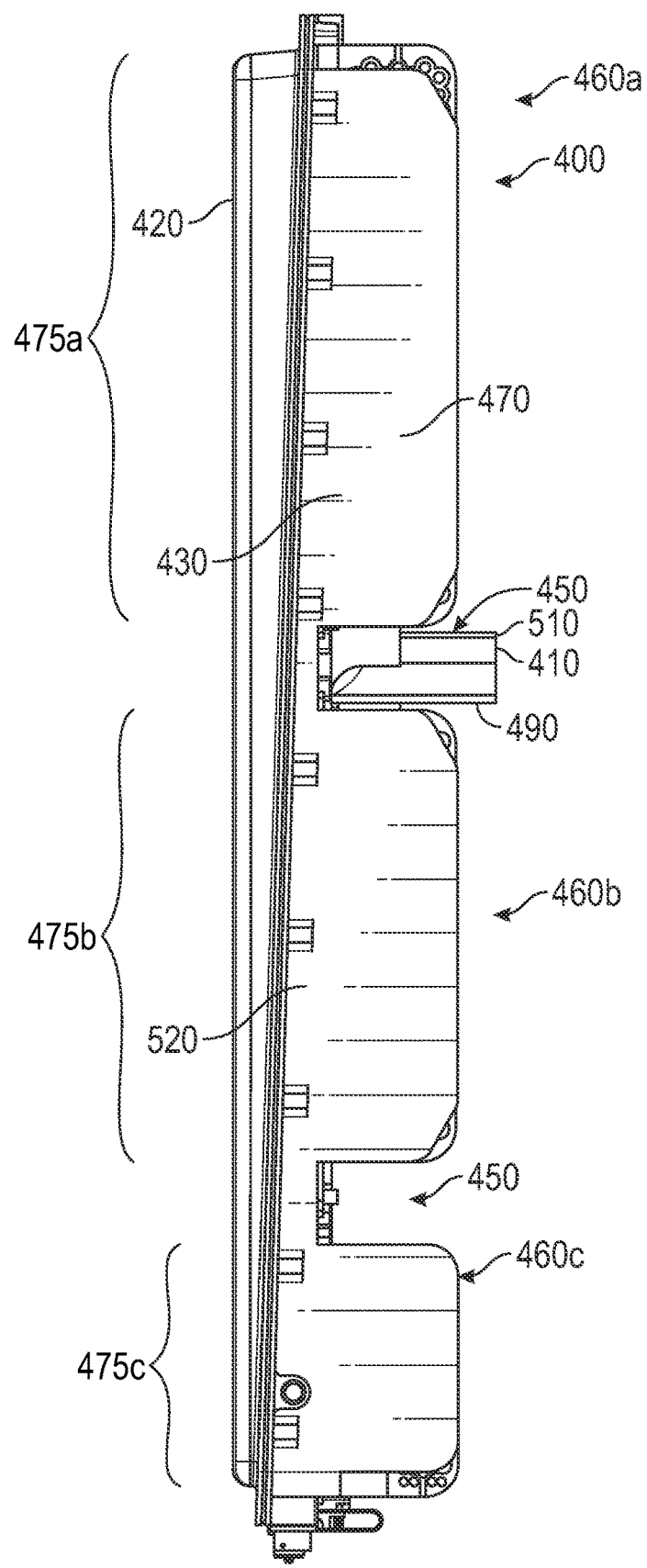
FIG. 8 is a side view of the device of FIG. 4 with the aerofoil installed.
Figure 9:
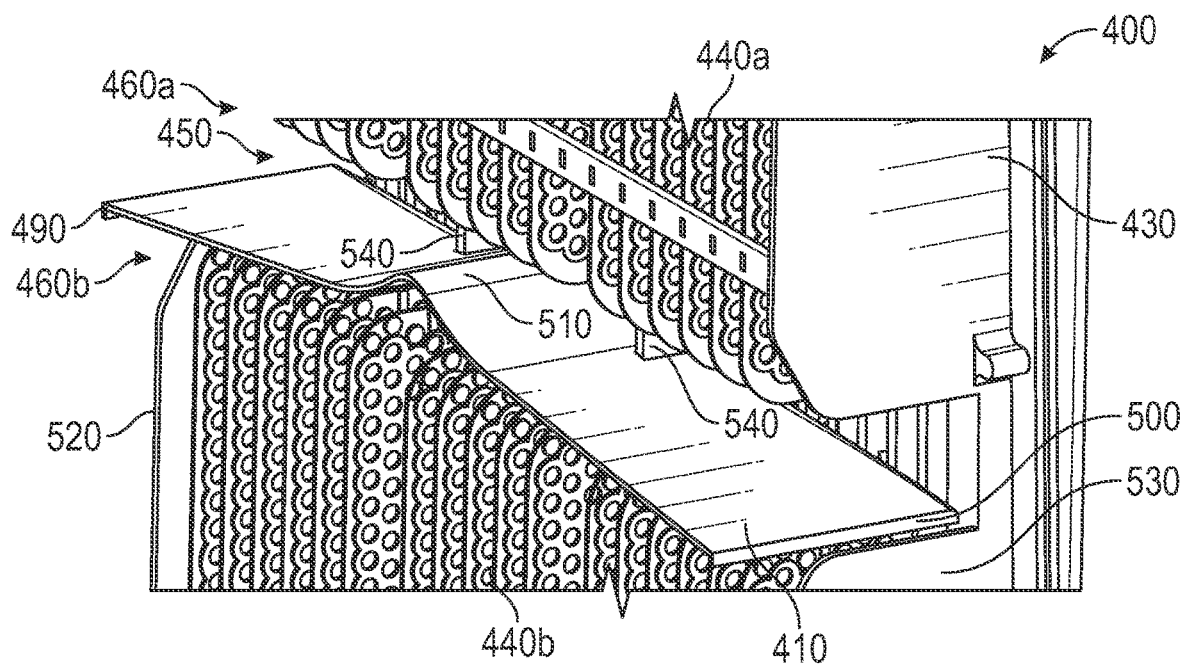
FIG. 9 is a detailed perspective view of a portion of the device of FIG. 4 with the aerofoil installed.
Figure 10:
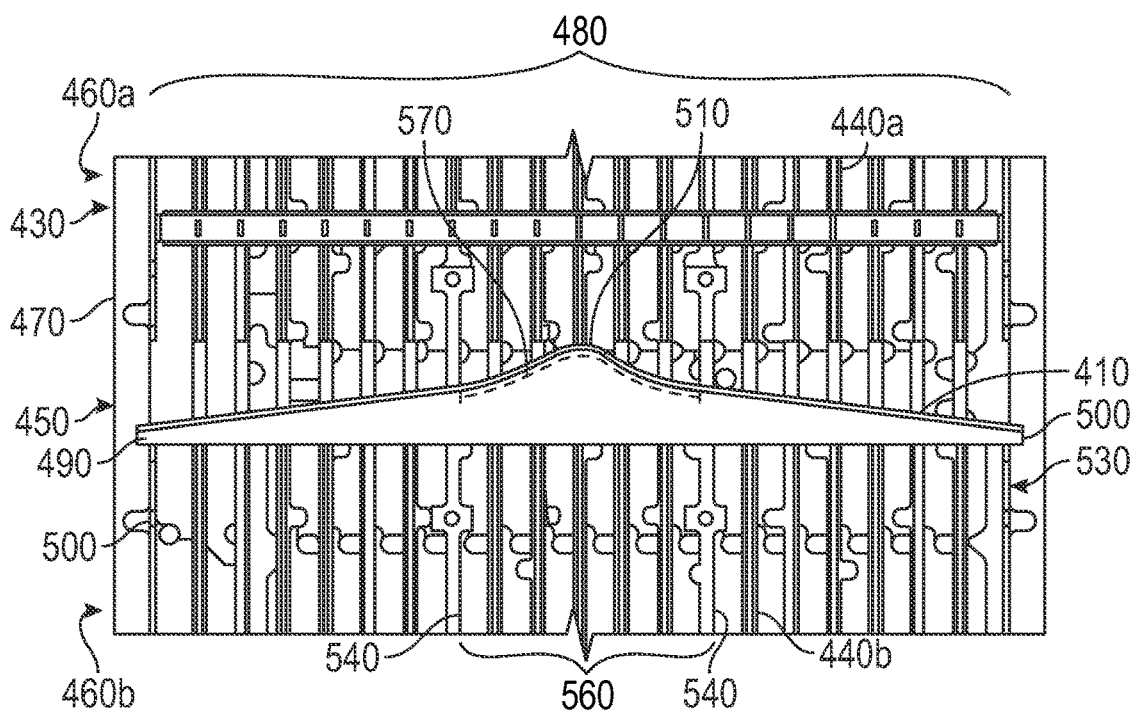
FIG. 10 is a detailed elevation view of a portion of the device of FIG. 4.

FIG. 4 is a perspective view of a device 400 in accordance with this disclosure without an aerofoil 410 installed. FIG. 5 is a perspective view of the device 400 of FIG. 4 with an uninstalled aerofoil 410. FIG. 6 is an elevation view of the device 400 of FIG. 4 with the aerofoil 410 installed. FIG. 7 is a perspective view of the device 400 of FIG. 4 with the aerofoil 410 installed. FIG. 8 is a side view of the device 400 of FIG. 4 with the aerofoil 410 installed. FIGS. 9 and 10 are detailed perspective and elevation views respectively of a portion of the device 400 of FIG. 4 with the aerofoil 410 installed.

As shown, the device 400 is a heatsink chassis. The device typically supports various electronics which may be installed on a mounting surface enclosed within a housing 420. This disclosure relates to the heatsink structure 430 located opposite the mounting surface. Accordingly, the chassis 400 typically comprises a circuit board mounting surface on a first side. The heatsink structure 430 then typically includes fins 440a, b, c that extend from the chassis 400 on a second side opposite the circuit board mounting surface.

The heatsink chassis 400 typically includes the heatsink structure 430 which has a plurality of fins 440a, b, c, divided into various sets of fins, extending from the Chassis 400 for extracting heat from electronics, such as a circuit board or the like, mounted on the chassis.

The heatsink structure 430 may be provided with thermal breaks 450 dividing the heatsink into the various fin sections 460a, b, c. Each such thermal break 450 takes the form of an air gap between the corresponding sets of fins 440a, b, c, thereby defining the various fin sections 460a, b, c. Accordingly, the plurality of fins 440a, b, c are organized into at least two, and in the embodiment shown, three, fin sections 460a, b, c. A first fin section 460a then includes a first set of fins 440a, and a second fin section 460b includes a second set of fins 440b. In the embodiment shown, a third fin section 460c is provided as well, and that includes a third set of fins 440c.

Accordingly, the sets of fins 440a, b, c each comprise a separate plurality of fins, all of which are portions of the heatsink structure 430. The sets of fins 440a, b, c, are then divided from each other by thermal breaks 450. Such thermal breaks 450 prevent heat from one set of fins 440a from conducting heat to a second set of fins 440b, and therefore allow cooling at different portions of the heatsink structure 430 to be managed independently. However, this approach also reduces the total heat capacity of the individual fin sections 460a, b, c of the heatsink structure 430.

The provision of the thermal breaks 450 provides an additional benefit of allowing air flow to pass through the heatsink structure 430 from a side 470 of the chassis 400. Accordingly, while the total heat capacity of the fin 440a, b, c of the heatsink structure 430 may be reduced, the ability of the device to shed heat by convection may be kept at a high level by allowing for additional air flow. However, if the thermal break 450 does not provide an interruption between the individual fin sections 460a, b, c, heat can still cross between fin sections by way of convection.

The heatsink chassis 400 is then further provided with an aerofoil 410 fixed in at least one of the air gaps defining a corresponding thermal break 450. As such, the aerofoil 410 inhibits air flow between a first fin section 460a and a second fin section 460b, thereby preventing convection between the fin sections.

It is noted that the aerofoil 410 provided is referring to any relatively planar structure for inhibiting airflow between fin sections 460a, b, c. Such an element is not intended to be limited to a structure having a curved surface for generating lift, as in an aircraft wing. The term is instead used here to describe the generally planar but typically curved nature of the structure. Further, in most embodiments discussed herein, the aerofoil 410 is shaped so as to direct airflow as appropriate.

Generally, as shown, the fins 440a of the first fin section 460a and the fins 440b of the second fin section 460b, as well as the fins 440c of the third fin section, are each arranged in substantially parallel planes to each other. As such, fins 440a, b, c extend in a direction perpendicular to a plane of the chassis 400 and in parallel with each other. Generally, the fins 440a, b, c may be arranged to that they would be generally contiguous between the fin sections 460a, b, c if the thermal breaks 450 are ignored. In contrast, while the aerofoil 410 extends from the chassis 400 in the same direction as the fins 440a, b, c, that is, perpendicular to the plane of the chassis, the aerofoil is not parallel to the first set of fins 440a.

Accordingly, while the flow of air might otherwise cross the thermal breaks 450 in the direction of a channel between adjacent fins 440a of the first fin section 460a and continue to a channel between adjacent fins 440b of the second fin section 460b, thereby generating convection across the fin sections 460a, b, such air flow is inhibited by the aerofoil 410.

In some embodiments, a substantially planar aerofoil 410 may be provided that is perpendicular to fins 440a, b, c of the heatsink structure 430. Such an aerofoil, not shown, would inhibit air flow, and would thereby allow each fin section 460a, b, c to be independently designed and regulated.

In contrast with this approach, in the embodiment shown, at least a portion of the aerofoil 410 is angled with respect to a line perpendicular to the first set of fins 440a. The configuration of the aerofoil 410 allows for control over air flow, such that one or more of the fin sections 460a, b, c may be provided with more air flow than another.

Generally, as shown, each of the fin sections 460a, b, c has a length 475a, b, c, and a width 480. Each fin 440a, b, c of the fin sections 460a, b, c is the elongated substantially in parallel to the length 475a, b, c of the corresponding fin section. The fins 40a, b, c are then spaced apart along the width of the corresponding fin sections 460a, b, c. It is noted that because of the configuration of the different fin sections 460a, b, c, the fin sections may have different lengths 475a, b, c, but typically share a width 480.

In this context, the aerofoil 410 is located in a thermal break 450 between two fin sections 460a, b, and extends along the width of the adjacent fin sections 460a, b, c. The aerofoil 410 is typically bent such that it angles towards the second fin section 460b at both ends of the width.

During use, and when installed as shown in FIG. 2, the second fin section 460b may be located below the first fin section 460a. However, various configurations are contemplated.

The aerofoil 410 located between the first fin section 460a and the second fin section 460b generates a temperature differential between the first fin section and the second fin section. Such a temperature differential may be generated simply by preventing convection, as discussed above. This may be because, for example, circuitry opposite a first fin section 460a generates more heat than circuitry opposite a second fin section 460b. Accordingly, the aerofoil 410 simply prevents the heating of the portion of the heatsink opposite circuitry that runs cooler. This may be beneficial where certain circuitry is required to run cooler than other circuitry on the same board.

Further, by providing a bent aerofoil 410, such as that shown, incoming cooling air flow may be directed so as to cool a portion of the heatsink that requires additional cooling. Accordingly, the aerofoil 410 may actively generate a temperature differential by directing incoming cooling air towards the first fin section 460a and away from the second fin section 460b.

Accordingly, where the thermal break 450 forms a channel perpendicular to the fins 440a, b of the first set of fins and the second set of fins, the aerofoil 410 may direct air flow entering the channel towards the first fin section 460a and away from the second fin section 460b.

Accordingly, in the embodiment shown, the aerofoil 410 has a first end 490, a second end 500, and a center 510, and the first and second ends 490, 500 are closer to the second fin section 460b than the center 510. Further, the first end 490 and the second end 500 of the aerofoil 410 may be adjacent a first and last fin 520, 530 of the second set of fins 460a. The first and second end 490, 500 may then inhibit air flow entering the channel 450 from entering the second fin section 460b. As such, cooling air is directed primarily or exclusively towards the first fin section 460a, thereby resulting in a temperature differential between the first fin section 460a and the second fin section 460b.

In this way, if circuitry opposite one of the fin sections 460a, b, c is known to generate more heat than that opposite other sections, or if specific circuitry has cooling requirements different than other circuitry, cooling air can be appropriately directed and a differential can be maintained.

As shown, the first fin section 460a and the second fin section 460b are typically not enclosed by a housing, and as such, heated air exits the second fin section in a direction perpendicular to the fins 440b and the aerofoil 410. Accordingly, even when the thermal breaks 450 do not provide cooling air flow directed towards a specific fin section, the corresponding fins 440b can still shed heat in the traditional manner.

As shown, the chassis 400 may include at least one support structure 540 for locating the aerofoil 410 relative to the first fin section 460a and the second fin section 460b. The support structure 540 may be at least one blade extending from the chassis in parallel with the fins 440a, b, c. As shown, the support structure 540 may be two blades which may extend into the fin sections 460a, b, c adjacent the intended location of the aerofoil 410. Accordingly, the support structure 540 may pass between fins 440a, b of each of the surrounding fin sections 460a, b. In some embodiments, the support structure 540 may displace adjacent fins 440a, b, so as to provide additional space for the fins.

In the embodiment shown, the aerofoil 410 includes at least one slot 550. The aerofoil is then located by positioning the slot 550 on the at least one blade 540 making up the support structure. Accordingly, where the support structure 540 comprises two blades, two slots 550 are provided in the aerofoil 410 in order to fix a position of the aerofoil. Further, in the embodiment shown, as discussed above, the aerofoil 410 is bent such that the first and second ends 490, 500 extend towards the second fin section 460b. In such an embodiment, the two blades 540 may be provided with a distance 560 between them, while the slots 550 may have a distance between them 570 along a surface of the aerofoil 410. The distance 570 between the two slots 550 may then be greater than the distance 560 between the two blades 540.

As noted above, the aerofoil 410 is discussed in terms of a thermal break 450 between a first and second fin section 460a, b. However, as shown, a third fin section 460c may be provided as well, with a second thermal break 450 located between the second and third fin sections 460b, c. Accordingly, a third set of fins 440c may be provided, and in some embodiments, a second aerofoil 410 may be provided to improve heat characteristics associated with the second and third fin sections 460b, c. Such an aerofoil 410 may therefore be provided based on the heat requirements of circuitry located opposite the second and third fin sections 460b, c.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A chassis for a circuit board having a heatsink, the chassis comprising:
   a first surface;
   a plurality of fins extending from the first surface, the plurality of fins being organized into at least two fin sections, wherein a first fin section of the at least two fin sections comprises a first set of fins of the plurality of fins and a second fin section of the at least two fin sections comprises a second set of fins of the plurality of fins;
   a thermal break between the first fin section and the second fin section, the thermal break being an air gap between the first set of fins and the second set of fins; and
   an aerofoil fixed in the air gap and inhibiting air flow between the first fin section and the second fin section;
   wherein the fins of the first set of fins and the fins of the second set of fins are each arranged in substantially parallel planes to each other; and
   wherein, in a top view from a first direction perpendicular to the first surface, the aerofoil extends in a second direction parallel to a direction in which the fins of the second set of fins are aligned and has a central portion that is positioned closer to the first fin section in a third direction from the second fin section toward the first fin section than both ends of the aerofoil in the second direction.

2. The chassis of claim 1, wherein the aerofoil directs air flow flowing along the second direction within the air gap towards the first fin section.

3. The chassis of claim 2, wherein, in the top view from the first direction, the aerofoil extends in the second direction equal to or longer than a distance between a first and last fin of the second set of fins to inhibit air flow within the air gap from entering the second fin section.

4. The chassis of claim 3, wherein the first fin section and the second fin section are not enclosed by a housing, such that heated air exits the second fin section in the first direction.

5. The chassis of claim 1 further comprising at least one support structure for locating the aerofoil relative to the first fin section and the second fin section.

6. The chassis of claim 5, wherein the at least one support structure is at least one blade extending from the first surface in parallel with the plurality of fins, and wherein the at least one blade extends into each of the first fin section and the second fin section and passes between fins of each of the first set of fins and the second set of fins.

7. The chassis of claim 6, wherein the aerofoil comprises at least one slot, and wherein the aerofoil is located by positioning the slot on the at least one blade.

8. The chassis of claim 7, wherein the at least one support structure is two blades, and wherein the aerofoil comprises two slots, and wherein the aerofoil is positioned such that each of the two slots receives a respective one of the two blades.

9. The chassis of claim 1 further comprising a circuit board mounting surface, and wherein the first surface is opposite of the circuit board mounting surface.

10. The chassis of claim 9 further comprising a first group of circuitry and a second group of circuitry mounted on the circuit board mounting surface, wherein the first group of circuitry is mounted opposite the first fin section and the second group of circuitry is mounted opposite the second fin section, and wherein the first group of circuitry requires a lower operating temperature than the second group of circuitry.

11. The chassis of claim 9 further comprising a first group of circuitry and a second group of circuitry mounted on the circuit board mounting surface, wherein the first group of circuitry is mounted opposite the first fin section and the second group of circuitry is mounted opposite the second fin section, and wherein the first group of circuitry generates more heat than the second group of circuitry.

12. The chassis of claim 1 further comprising a third fin section comprising a third set of fins and a second thermal break between the third fin section and the first and second fin sections.

* * * * *